US009780532B1

(12) United States Patent
Tabataba-Vakili et al.

(10) Patent No.: US 9,780,532 B1
(45) Date of Patent: Oct. 3, 2017

(54) VERTICAL EXTERNAL CAVITY SURFACE EMITTING LASER UTILIZING AN EXTERNAL MICROMIRROR ARRAY

(71) Applicant: Palo Alto Research Center Incorporated, Palo Alto, CA (US)

(72) Inventors: Farsane Tabataba-Vakili, Paris (FR); Thomas Wunderer, Santa Cruz, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/357,699

(22) Filed: Nov. 21, 2016

(51) Int. Cl.
| | |
|---|---|
| *H01S 3/08* | (2006.01) |
| *H01S 5/183* | (2006.01) |
| *H01S 5/04* | (2006.01) |
| *H01S 5/187* | (2006.01) |
| *H01S 5/024* | (2006.01) |
| *H01S 5/343* | (2006.01) |
| *H01S 5/14* | (2006.01) |
| *H01S 5/10* | (2006.01) |

(52) U.S. Cl.
CPC ...... *H01S 5/18361* (2013.01); *H01S 5/02476* (2013.01); *H01S 5/04* (2013.01); *H01S 5/1025* (2013.01); *H01S 5/14* (2013.01); *H01S 5/141* (2013.01); *H01S 5/187* (2013.01); *H01S 5/18305* (2013.01); *H01S 5/18366* (2013.01); *H01S 5/18369* (2013.01); *H01S 5/343* (2013.01)

(58) Field of Classification Search
CPC .... H01S 5/18361; H01S 5/02476; H01S 5/04; H01S 5/18305; H01S 5/187; H01S 5/343; H01S 5/18366; H01S 5/18369; H01S 5/14; H01S 5/141; H01S 5/1025
See application file for complete search history.

(56) References Cited

U.S. PATENT DOCUMENTS

| | | | |
|---|---|---|---|
| 6,282,213 B1 * | 8/2001 | Gutin | H01S 5/141 372/20 |
| 6,404,555 B1 | 6/2002 | Nishikawa | |
| 8,660,154 B1 * | 2/2014 | Strong | G11B 7/127 372/10 |
| 9,112,331 B2 | 8/2015 | Northrup et al. | |
| 9,112,332 B2 | 8/2015 | Wunderer et al. | |
| 2002/0163688 A1 | 11/2002 | Zhu et al. | |
| 2003/0231692 A1 * | 12/2003 | Belikov | G02B 5/1828 372/102 |
| 2005/0180019 A1 | 8/2005 | Cho et al. | |
| 2012/0206725 A1 * | 8/2012 | Vukovic-Cvijin | G01J 3/10 356/402 |

* cited by examiner

*Primary Examiner* — Kinam Park
(74) *Attorney, Agent, or Firm* — Womble Carlyle Sandridge & Rice LLP

(57) ABSTRACT

Disclosed herein are embodiments of a vertical external cavity surface emitting laser (VECSEL) device that utilizes an external micromirror array, and methods of fabricating and using the same. In one embodiment, a VECSEL device includes a gain chip, a mirror, and a micromirror array. The gain chip includes a gain medium. The micromirror array includes a plurality of curved micromirrors. The micromirror array and the mirror define an optical cavity, and the micromirror array is oriented such that at least one of the curved micromirrors is to reflect light generated by the gain medium back toward the gain medium along a length of the optical cavity.

20 Claims, 9 Drawing Sheets

VERTICAL EXTERNAL CAVITY SURFACE EMITTING LASER UTILIZING AN EXTERNAL MICROMIRROR ARRAY

STATEMENT REGARDING FEDERALLY SPONSORED RESEARCH AND DEVELOPMENT

This invention was made with government support under Contract No. HR0011-15-C-0025 awarded by the Defense Advanced Research Projects Agency. The Government has certain rights in this invention.

TECHNICAL FIELD

The presently disclosed embodiments are directed to laser devices, and, more particularly, to vertical external cavity surface emitting laser devices.

BACKGROUND

Semiconductor light emitting devices are used in numerous applications, including, but not limited to, data storage, displays, lighting, sensors, phototherapy, and medical diagnostics. Light emitting devices that emit in spectral ranges suitable for these applications can be fabricated based on a variety of material systems, including group III-V and II-VI binary, ternary, and quaternary compounds, as well as alloys and various combinations thereof.

Vertical external cavity surface emitting laser (VECSEL) devices are of interest due to their ability to achieve both high optical power output and high beam quality with superior spatial and spectral characteristics. Current VECSEL devices utilize relatively large external mirrors, however, these mirrors are difficult to align and limit the overall compactness of the device.

SUMMARY

The following presents a simplified summary of various aspects of the present disclosure in order to provide a basic understanding of such aspects. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

According to some aspects of the present disclosure, there is provided a laser device comprising a gain chip, a mirror, and a micromirror array. The gain chip comprises a gain medium adapted for stimulated photon emission. The micromirror array comprises a plurality of curved micromirrors. The gain chip is disposed between the mirror and the micromirror array. The micromirror array and the mirror define an optical cavity, and the micromirror array is oriented such that at least one of the plurality of curved micromirrors is to reflect light generated by the gain medium back toward the gain medium and the mirror along a length of the optical cavity.

In certain embodiments, the mirror is integrated into the gain chip. In other embodiments, the mirror is separate from the gain chip.

In certain embodiments, each of the plurality of curved micromirrors comprises a distributed Bragg reflector (DBR) layer.

In certain embodiments, the length of the optical cavity is from 3 mm to 15 mm.

In certain embodiments, each of the plurality of curved micromirrors has a radius of curvature of 10 mm to 30 mm.

In certain embodiments, a center-to-center pitch of the micromirror array is 0.05 mm to 2 mm.

In certain embodiments, the laser device further comprises a pump source.

In certain embodiments, the pump source comprises an electron beam source. In certain embodiments, the electron beam source is arranged to direct an electron beam toward the gain medium along a direction non-parallel to the length of the optical cavity.

In certain embodiments, the pump source comprises a laser source. In certain embodiments, the laser source is arranged to direct a laser beam toward the gain medium along a direction non-parallel to the length of the optical cavity. In other embodiments, the laser source is arranged to direct the laser beam toward the gain medium along a direction parallel to the length of the optical cavity.

In certain embodiments, the laser device further comprises a heat spreader disposed below the mirror of the gain chip. In certain embodiments, the mirror comprises a DBR. In certain embodiments, the mirror is disposed between the gain medium and the heat spreader (e.g., if the heat spreader is non-transparent). In other embodiments, the mirror is disposed on an opposite side of the heat spreader such that the heat spreader is disposed between the gain medium and the mirror (e.g., if the heat spreader is transparent).

In certain embodiments, the gain medium is selected from a multiple quantum well (MQW) structure, a quantum dot layer, a double heterojunction, and combinations thereof.

In certain embodiments, the laser device is incorporated into a vacuum tube.

According to other aspects of the present disclosure, there is provided a method of generating a laser. The method comprises focusing an electron beam onto a gain medium of a gain chip to generate light. The gain chip is disposed between a mirror and a micromirror array. The gain chip is disposed at a first end of an optical cavity, and the micromirror array is disposed at a second end of the optical cavity opposite the first end. The micromirror array comprises a plurality of curved micromirrors. Light generated by the gain chip is reflected back toward the gain chip by at least one of the plurality of curved micromirrors to focus the laser, and the laser is emitted through the mirror at the first end of the optical cavity or through the micromirror array at the second end of the optical cavity. In certain embodiments, an emission wavelength of the laser generated by the method is from 200 nm to 400 nm.

According to other aspects of the present disclosure, there is provided a method of constructing a laser device. The method comprises positioning a micromirror array at a first end of an optical cavity, the micromirror array comprising a plurality of curved micromirrors; and positioning a gain chip comprising a gain medium at a second end of the optical cavity opposite the first end. The micromirror array is oriented such that light generated by the gain chip is reflected back to the gain chip along a length of the optical cavity by the plurality of curved micromirrors.

In certain embodiments, the method further comprises forming the plurality of curved micromirrors by depositing layers of dielectric material with alternating refractive indices onto a substrate having an array of concave microlenses or or convex microlenses formed thereon.

BRIEF DESCRIPTION OF THE DRAWINGS

The present disclosure is illustrated by way of example, and not by way of limitation, in the figures of the accompanying drawings, in which.

DETAILED DESCRIPTION

Described herein are embodiments of a vertical external cavity surface emitting laser (VECSEL), also known as a thin disk laser, methods for fabricating the same, and methods of using the same. In certain embodiments, the VECSEL utilizes an external curved micromirror array and a gain chip with one integrated mirror. By utilizing the curved micromirror array, the overall VECSEL device can be designed in a more compact fashion. With increased compactness, the VECSEL device can be easily incorporated into a vacuum tube, facilitating electron beam pumping for generating lasers in the UV range (e.g., less than 240 nm). Moreover, the compactness facilitates in situ beam alignment while the VECSEL is within the vacuum tube. Multiple spots on the gain chip may be excited by scanning the excitation source across the gain chip or moving the gain chip, with each spot corresponding to different micromirrors in the array. In certain embodiments, a large area of the gain chip may be pumped to simultaneously allow lasing of multiple micro-VECSELs, resulting in a higher overall optical power output compared to conventional VECSEL designs.

As used herein, "micromirror" refers to a structure having a light-reflecting material, with a maximum linear dimension of the structure being less than or equal to 1 millimeter (mm). As used herein, a "curved micromirror" refers to a micromirror wherein the light-reflecting material forms a curved surface. A curved micromirror may have a cross-sectional profile that is, for example, spherical, parabolic, or another type of curved profile.

Figure 1:
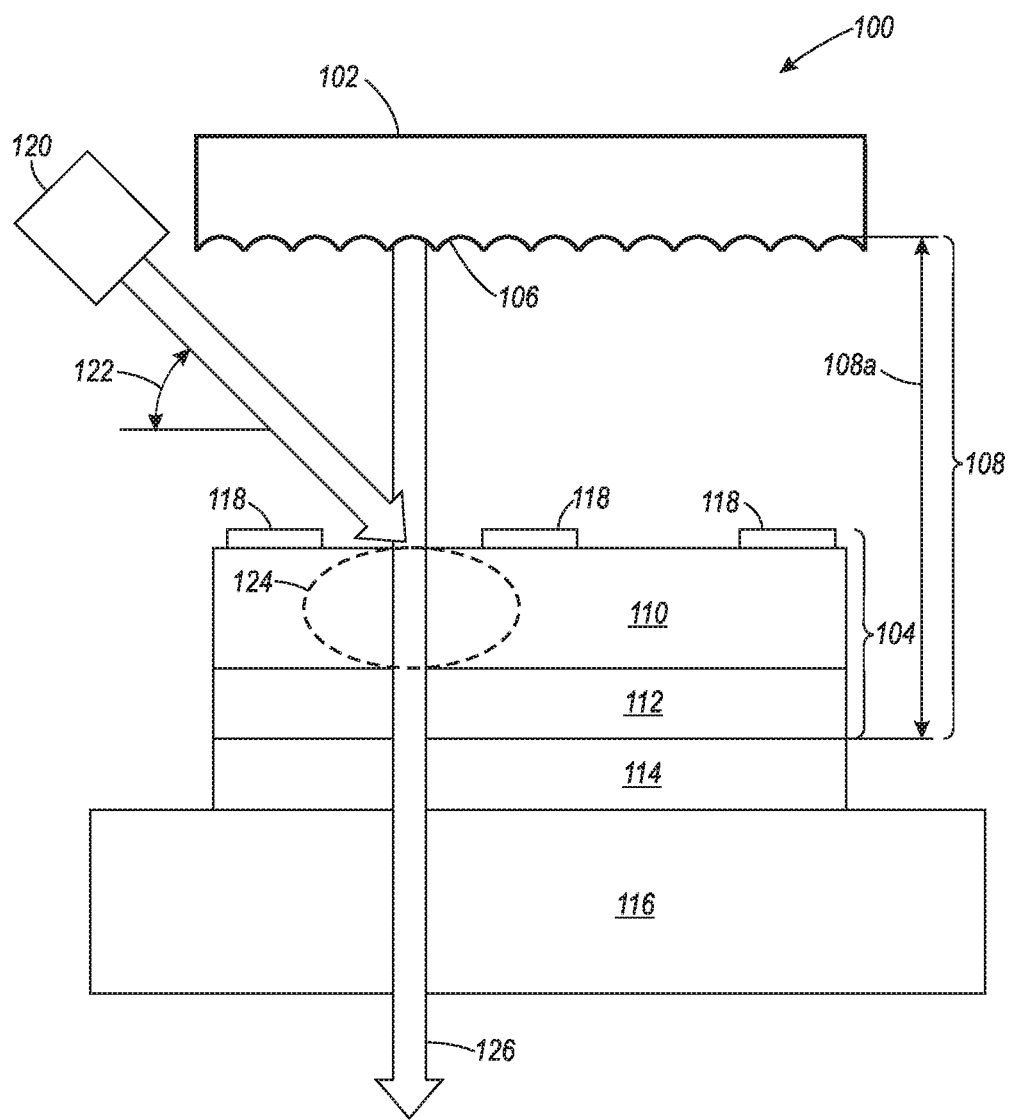
FIG. 1 is a schematic of an embodiment of a vertical external surface emitting laser (VECSEL) device.

FIG. 1 is a schematic of an exemplary embodiment of a laser device 100 (e.g., a VECSEL device). The laser device 100 includes a micromirror array 102, a gain chip 104, and a mirror 114. The micromirror array 102 includes a plurality of curved micromirrors 106. The micromirror array 102 is arranged such that concave surfaces of the curved micromirrors 106 face the gain chip 104.

The gain chip 104 includes a gain medium 110 and a substrate 112. In certain embodiments, the substrate 112 may comprise silicon, germanium, gallium arsenide, indium phosphide, aluminum oxide, gallium nitride, aluminum nitride, other semiconductor materials or insulators, or combinations thereof. In other embodiments, the substrate 112 is optional and may be omitted. The gain medium 110 may be a multiple quantum well (MQW) structure, a layer comprising quantum dots, or a double heterojunction. In certain embodiments, the gain medium is an MQW structure that is epitaxially-grown on the substrate 112. The MQW structure may comprise, for example, alternating layers of AlGaN/AlN, InGaN/GaN, GaAs/AlGaAs, InGaAsP/InP, or other materials having properties (e.g., band gap) selected to produce a particular emission wavelength when excited by a pump source (e.g., a laser source or an electron beam source). As used herein, "multiple quantum well" or "MQW" refers to a multi-layered semiconductor structure for which quantum mechanical effects may be controlled. Each quantum well (which may comprise a multi-layer stack defining a barrier-well-barrier) within the MQW structure confines electrons and holes in one dimension, but allow movement of the carriers in other dimensions.

A mirror 114 and heat spreader 116 are disposed beneath the gain chip 104. In certain embodiments, the mirror 114 is deposited or grown on the substrate 112 (e.g., below the substrate 112 or above the substrate 112). In certain embodiments, the mirror 114 may be a distributed Bragg reflector (DBR), which may comprise alternating layers of at least two different dielectric or semiconductor materials having a refractive index contrast. In certain embodiments, the alternating layers of the DBR may be selected from GaAs/AlAs, AlGaN/AlN, $SiO_2/Al_2O_3$, $SiO_2/HfO_2$, $SiO_2/Ta_2O_5$, and $SiO_2/TiO_2$. In certain embodiments, $SiO_2/Al_2O_3$ or $SiO_2/HfO_2$ may be used when generating a deep UV laser. In certain embodiments, $SiO_2/Ta_2O_5$ or $SiO_2/TiO_2$ may be used when generating a blue laser. In certain embodiments, the mirror 114 may be a DBR layer that is epitaxially grown adjacent to the gain medium 110 in a single growth run, resulting in the mirror 114 being disposed directly above the substrate 112, and the gain medium 110 being disposed directly above the mirror 114.

The micromirror array 102 and the mirror 114 define an optical cavity 108 for lasing, with the micromirror array 102 being located at a first end of the optical cavity 108 and the gain chip 104 and mirror 114 being located at second end of the optical cavity 108 opposite the first end. A cavity length 108a of the optical cavity 108 extends from the highest point of curvature of at the surface of the micromirror array 102 to the mirror 114. In certain embodiments where the mirror 114 is located below the heat spreader 116, the cavity length 108a extends through the heat spreader 116 to the mirror 114.

In certain embodiments, a material of the heat spreader 116 is selected from $SiO_2$, quartz, synthetic diamond, aluminum nitride, beryllium oxide, and combinations thereof. In certain embodiments, the mirror 114 is bonded to the heat spreader 116.

A pump source 120 is used to generate a laser beam 126. The pump source 120 may provide an excitation beam (e.g., a laser beam or an electron beam) at an incident angle 122 with respect to the gain medium 110. In certain embodiments, the incident angle 122 may be from 10° to 80°. In certain embodiments, the incident angle may be from 30° to 60°. In certain embodiments, the incident angle may be from 40° to 50° (e.g., 45°). In certain embodiments, if the excitation beam is a laser beam, the incident angle may be 90° or −90°. In certain embodiments, the laser beam 126 passes through the heat spreader 116, as depicted by FIG. 1. In other embodiments, the laser beam 126 passes through the micromirror array 102.

The excitation beam causes the gain medium 110 to emit light from an interaction volume 124 in random directions. When aligned with the micromirror array 102, emitted light that is initially reflected by one or more of the curved micromirrors 106 is reflected back and forth between the one or more curved micromirrors 106 and the mirror 114 through the gain medium 110. Spontaneously emitted photons cause stimulated emission within the gain medium 110 as they pass through it, and lasing is achieved when the gain outweighs the losses. In certain embodiments, a reflectivity of the mirror 114 is selected to be lower than the curved micromirrors 106. For example, a reflectivity of the mirror 114 may range from 97% up to 99.5%, and the reflectivity of the curved micromirrors 106 may range from 99.5% to 99.9% or greater. In certain embodiments, one or more metal contacts 118 may be disposed on the gain medium to provide an electrical path to ground for current generated in the gain medium 110 due to excitation by an electron beam source. In certain embodiments, the metal contacts 118 are optional and may be omitted, for example, when the pump source 120 is a laser source.

Figure 2:
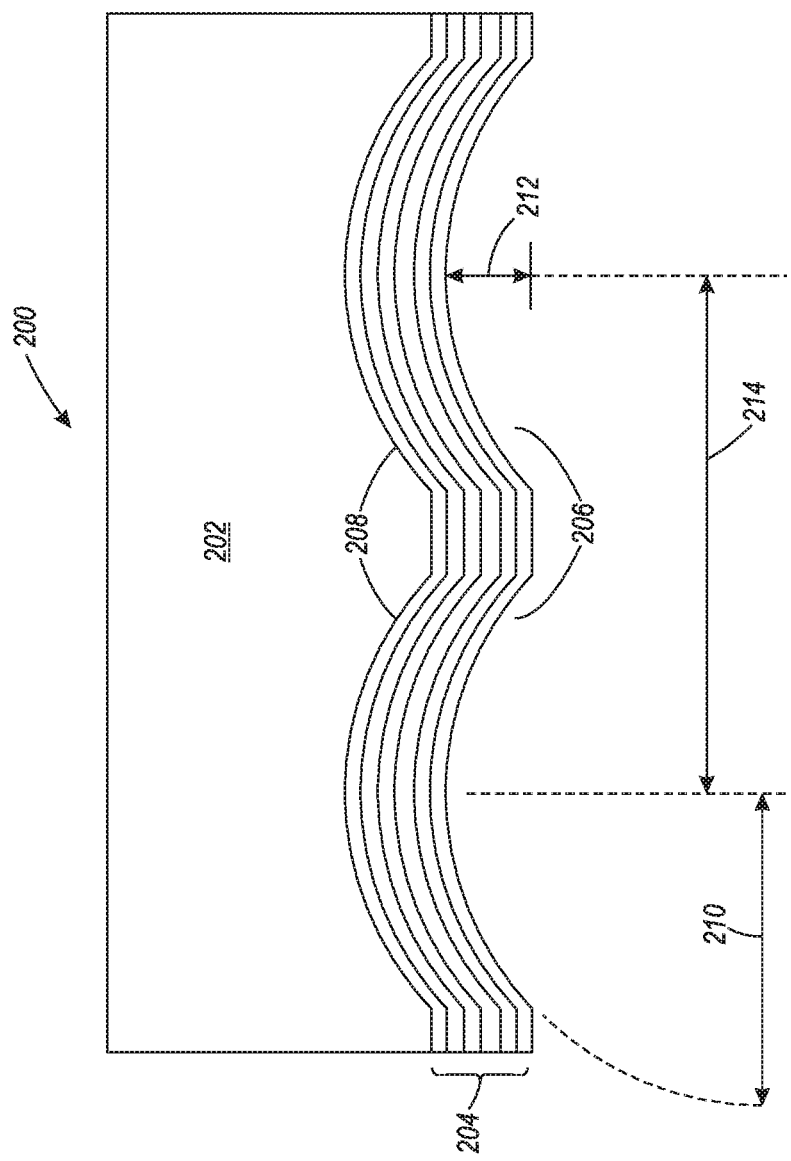
FIG. 2 is a schematic of an embodiment of a micromirror array.

FIG. 2 is a schematic of an embodiment of a micromirror array 200, which may be the same or similar to its identically named counterpart of FIG. 1. The micromirror array 200 includes a substrate 202, which may comprise fused silica, sapphire, glass, quartz, a semiconductor material (e.g., silicon, GaN, etc.), a metal, or other materials, particularly materials capable of being processed to produce optically smooth surfaces. The substrate 202 may have a plurality of wells 208 formed thereon (which may be referred to as concave microlenses), which may be periodically or aperiodically spaced along one or two dimensions of the substrate 202. A reflector layer 204 (which may be a multilayer stack) is disposed on the substrate 202 (e.g., along planar portions of the substrate 202) and within the wells 208 to form a plurality of curved micromirrors 206 having concave surfaces that are oriented away from the substrate 302. The reflector layer 204 comprises multiple layers of dielectric material with alternating indices of refraction. The material of the reflector layer 204 may be selected based on a particular emission wavelength of the gain chip. In certain embodiments, the reflector layer 204 is a DBR comprising alternating layers of dielectric material selected from SiO$_2$/Al$_2$O$_3$, SiO$_2$/HfO$_2$, SiO$_2$/Ta$_2$O$_5$, and SiO$_2$/TiO$_2$. In certain embodiments, the reflector layer 204 is an epitaxially-grown DBR comprising, for example, III-V or II-VI materials. In certain embodiments, the reflector layer 204 comprises alternating layers of semiconductor materials selected from GaAs/AlAs and AlGaN/AlN. In certain embodiments, the layers of within the reflector layer 204 may be continuous from one curved micromirror to another and across the substrate. In other embodiments, the reflector layer 204 is discontinuous, with DBRs formed only within the wells 208 and not on the substrate 202.

In certain embodiments, an aperture shape of the curved micromirrors 206 can be, for example, circular, square, pentagonal, hexagonal, octagonal, etc. In certain embodiments, each curved micromirror has a radius of curvature 210 from 50 μm to 20 mm. In certain embodiments, the radius of curvature 210 is from 100 μm to 10 mm. In certain embodiments, each curved micromirror 206 has a center-to-center pitch 214 from 50 μm to 2 mm. In certain embodiments, the center-to-center pitch 214 is from 100 μm to 1 mm. In certain embodiments, the depth 212 of each curved micromirror 206 is from 60 nm to 100 μm. In certain embodiments, the depth 212 is from 1 μm to 100 μm. In certain embodiments, the depth 212 is from 60 nm to 1 μm. In certain embodiments, the depth 212 is from 1 μm to 10 μm.

Figure 3:
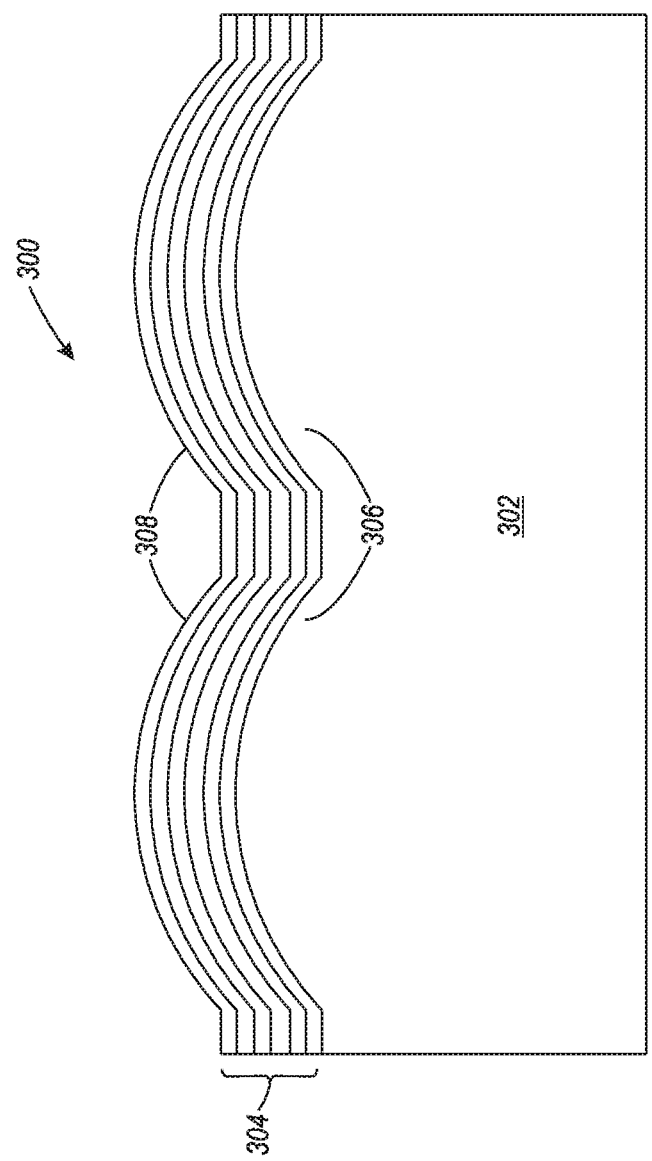
FIG. 3 is a schematic of a further embodiment of a micromirror array.

FIG. 3 is a schematic of a further embodiment of a micromirror array 300. The micromirror array 300 includes a substrate 302 having a plurality of convex microlenses 308 formed thereon. A reflector layer 304 is deposited onto the convex microlenses 308 to form curved micromirrors 306 having concave surfaces that are oriented toward the substrate 302. In such embodiments, substrate 302 may be selected from a material that is substantially transparent to a wavelength range emitted by the gain chip. Other aspects of the micromirror array 300 may be the same or similar to those of the micromirror array 200.

Figure 4:
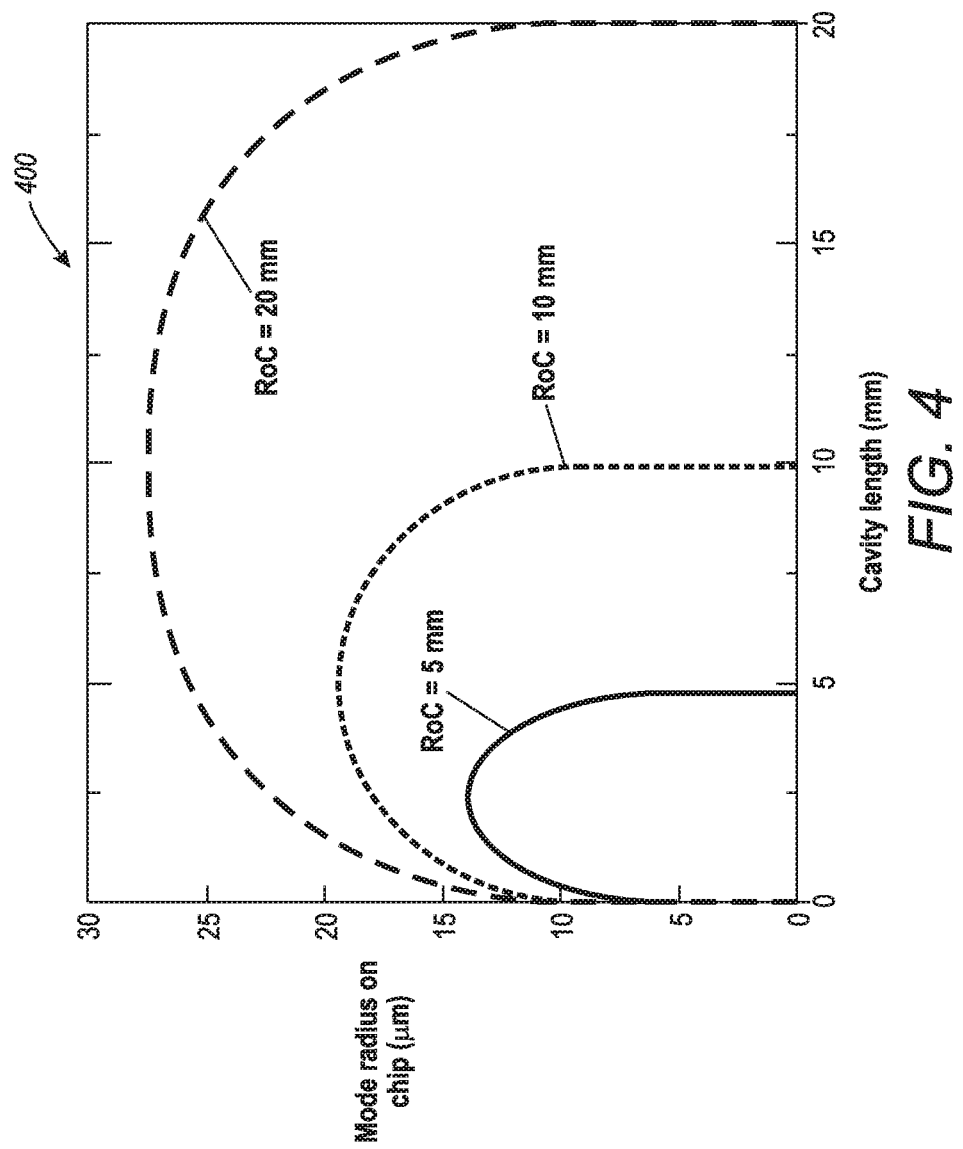
FIG. 4 is a plot showing how lasing mode radius on a gain chip varies with cavity length.
Figure 5:
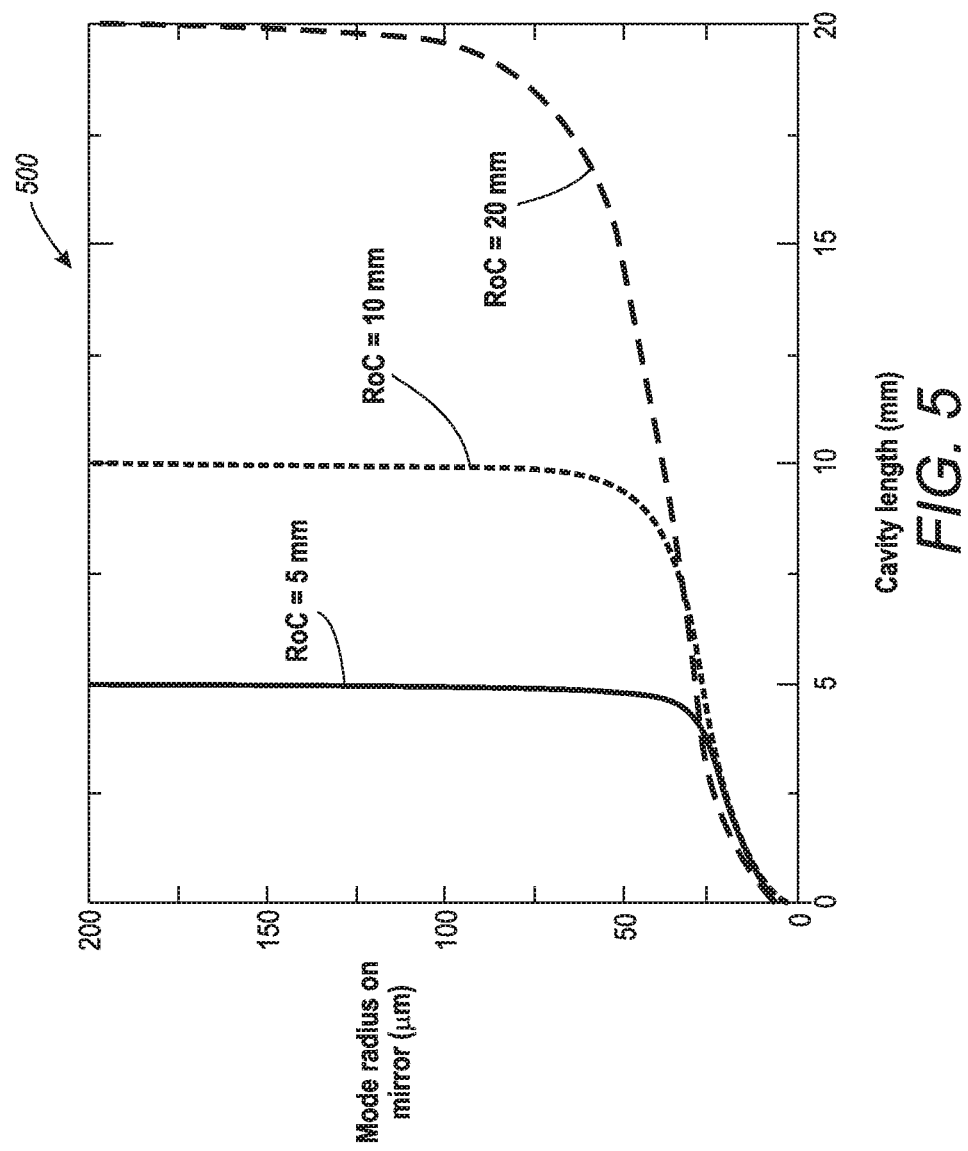
FIG. 5 is a plot showing how lasing mode radius on a micromirror varies with cavity length.

In certain embodiments, the radius of curvature (RoC) of the micromirrors is chosen in accordance with a selected cavity length and lasing mode radius both on the chip and on the external mirror. FIGS. 4 and 5 are plots 400 and 500, respectively showing how lasing mode radius varies with cavity length. The plot 400 shows the mode radius on the gain chip, and the plot 500 shows the mode radius on the mirror, with the computation being performed for microlenses having different radii of curvature (RoCs): 20 mm, 10 mm, and 5 mm. The mode radii can be calculated according to:

$$\omega_C^2 = \frac{\lambda L}{\pi} \sqrt{\frac{r_c - L}{L}}, \text{ and} \quad \text{(Eq. 1)}$$

$$\omega_M^2 = \frac{\lambda r_C}{\pi} \sqrt{\frac{L}{r_c - L}}, \quad \text{(Eq. 2),}$$

where $\omega_C$ and $\omega_M$ are the mode radii on the chip and on the mirror, respectively, $\lambda$ is the laser wavelength, $r_c$ is the microlens RoC, and L is the cavity length. Table 1 below shows computed mode radii for different RoCs and cavity lengths. Mode radius on the mirror is taken into account when selecting a center-to-center pitch for a particular lenslet density.

TABLE 1

| VECSEL mode radii (for λ = 237 nm) | | |
|---|---|---|
| | $\omega_C$ (μm) | $\omega_M$ (μm) |
| $r_c$ = 5 mm<br>L = 2.5 mm | 13.7 | 19.4 |
| $r_c$ = 10 mm<br>L = 5 mm | 19.4 | 27.5 |
| $r_c$ = 20 mm<br>L = 10 mm | 27.5 | 33.8 |

Figure 6:
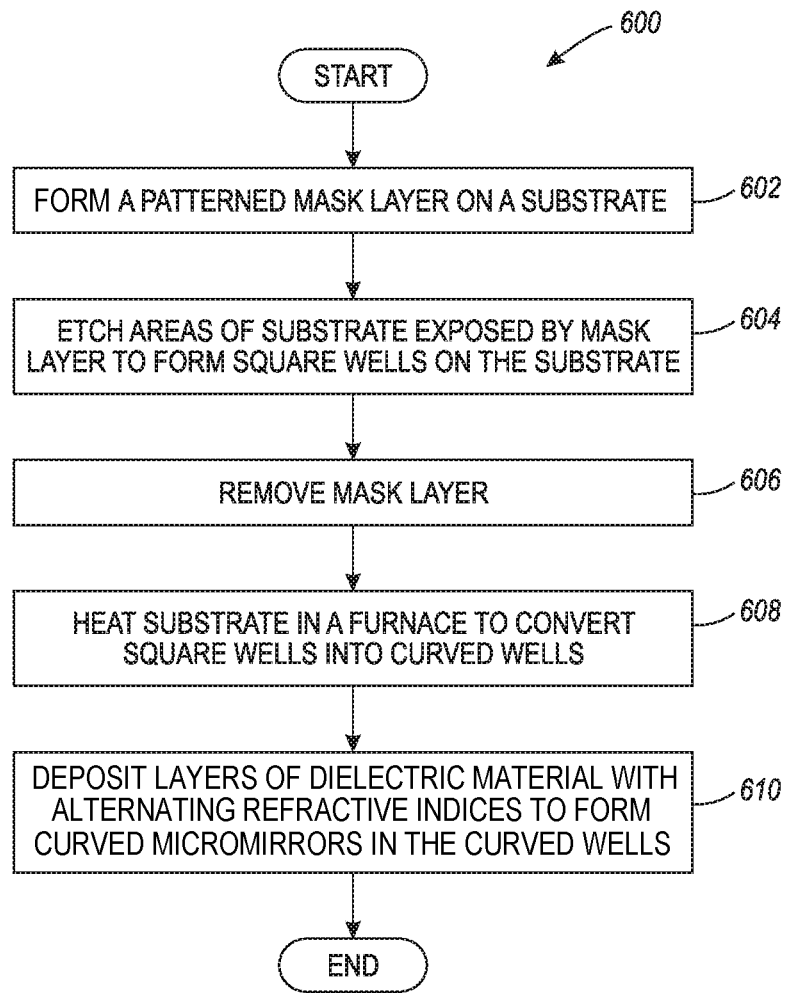
FIG. 6 is a flow diagram illustrating a method for fabricating a micromirror array in accordance with certain embodiments of the present disclosure.

FIG. 6 is a flow diagram illustrating an exemplary method 600 for fabricating a micromirror array in accordance with certain embodiments of the present disclosure. The method 600 begins at block 602, where a patterned mask layer is formed on a substrate (e.g., the substrate 202). In certain embodiments, the substrate comprises quartz. In certain embodiments, the mask layer comprises a photoresist (e.g., a positive or negative resist) or another material (e.g., AlN, TiAlN, etc.), which may be patterned using a suitable patterning technique (e.g., photolithography, electron beam lithography, etc.).

At block 604, areas of the substrate exposed by the patterned mask layer may be etched using a suitable etch technique (e.g., wet etching with hydrofluoric acid, gas phase etching, reactive ion etching, etc.). In certain embodiments, an array of wells having a square or rectangular profile is formed on the substrate as a result of the etching.

At block 606, the mask layer is removed (e.g., via planarization). In certain embodiments, one or more additional patterning steps may be performed. For example, a second mask layer may be patterned above the wells, followed by additional etching to form a stepped structure within the wells and subsequent removal of the second mask.

At block 608, the substrate is heated in a furnace to convert the square wells into concave curved wells. For example, the substrate may be loaded into a furnace having a temperature greater than 600° C. to promote mass transport of the substrate material, which smooths out rough surfaces and corners and results in an array of concave curved wells. In certain embodiments, block 606 occurs after block 608 (i.e., the mask layer is present when the substrate is heated in the furnace, and is removed after the heating), occurs later during the method 600, or is omitted entirely from the method 600.

At block 610, layers of dielectric material are deposited onto the substrate to produce a reflector layer (e.g., the reflector layer 204), resulting in an array of curved micromirrors (e.g., the curved micromirrors 206). In certain embodiments, the layers may be deposited with dielectric material of alternating indices of refraction to produce a DBR layer. In certain embodiments, the reflector layer is a continuous multilayered structure that is disposed on the substrate and within each of the wells. In other embodiments, the reflector layer is disposed within the wells and is not disposed on planar portions of the substrate. For example, the substrate may have been patterned with a mask layer prior to depositing the dielectric material. In certain embodiments, planarization may be performed after depositing the dielectric material to remove the dielectric material from the planar portions of the substrate.

In certain embodiments, the method 600 may be modified to yield a micromirror array structure similar to the micromirror array 300. For example, block 604 may be modified to produce an array of square or rectangular mesas. At block 608, the mesas are converted into convex microlenses, such as the convex microlenses 308. At block 610, the layers of dielectric material are deposited to form an array of curved micromirrors, such as the curved micromirrors 306.

Other methodologies for producing concave or convex microlenses may be used. For example, in certain embodiments, blocks 602, 604, and 606 may be modified such that one or more layers of photoresist may be patterned onto the substrate to produce photoresist mesas. The photoresist is then heated (e.g., at block 608) so that it reflows, resulting in curved surfaces formed in the photoresist pattern due to surface tension effects. The photoresist may be patterned to control the depth/height of the resulting mesas as well as the pitch therebetween. Anisotropic etching (e.g., dry etching) may then be performed to remove the photoresist and transfer the curved pattern into the substrate to form concave microlenses, followed by one or more additional processes to achieve an optically smooth surface. In other embodiments, to produce convex microlenses, the aforementioned process may be used to fabricate a mold which is then used to form the reverse pattern in a second substrate, which is used as the micromirror array after depositing a reflector layer thereon. In other embodiments, convective assembly of colloidal particles may be used rather than a photoresist pattern.

Figure 7:
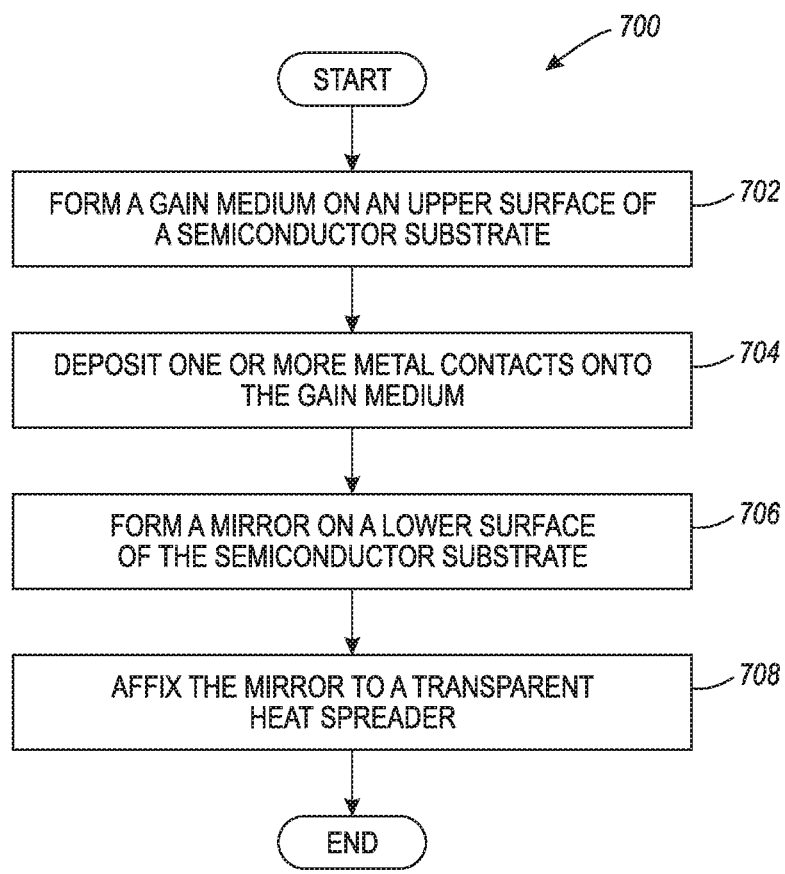
FIG. 7 is a flow diagram illustrating a method for fabricating a gain chip in accordance with certain embodiments of the present disclosure.

FIG. 7 is a flow diagram illustrating an exemplary method 700 for fabricating a gain chip in accordance with certain embodiments of the present disclosure. The method 700 begins at block 702, where a gain medium (e.g., the gain medium 110) is formed on an upper surface of a semiconductor substrate (e.g., the substrate 112). In certain embodiments, the gain medium comprises an MQW structure, a quantum dot layer, a double heterojunction layer, or a combination thereof. In embodiments that utilize an MQW structure, the MQW structure may be grown epitaxially using metalorganic vapor phase epitaxy (MOVPE), molecular beam epitaxy (MBE), or another suitable process. In certain embodiments, the MQW structure comprises a multilayered structure selected from alternating layers of AlGaN/AlN, InGaN/GaN, InGaAs/GaAs, InGaP/InAlGaP, Zn(S,Cd)Se/Zn(Mg,S)Se, CdSSe/CdS, and combinations thereof.

At block 704, one or more metal contacts (e.g., the metal contacts 118) are deposited onto the gain medium.

At block 706, a mirror (e.g., the mirror 114) is formed on a lower surface of the semiconductor substrate. In certain embodiments, the mirror comprises a DBR. In certain embodiments, the mirror is grown epitaxially on the lower surface of the semiconductor substrate. In other embodiments, the mirror is grown epitaxially on an upper surface of the semiconductor substrate, and may be formed in the same processing run as the gain medium.

In certain embodiments, the semiconductor substrate is thinned prior to forming the mirror. For example, the substrate may be thinned by conventional lapping or chemical-mechanical polishing (CMP). As another example, an etch-stop layer may be used to selectively etch the substrate, for example, using photoenhanced chemical etching (PEC). In certain embodiments, the substrate is thinned such that an overall thickness of the substrate and gain medium is from 5 µm to 30 µm, or from 5 µm to 10 µm. In other embodiments, the semiconductor substrate is removed entirely (or with a frame remaining to provide structural support) and the mirror is formed directly on a lower surface of the gain medium.

At block 708, the mirror is affixed to a transparent heat spreader (e.g., the heat spreader 116). In certain embodiments, the heat spreader comprises one or more of $SiO_2$, quartz, or synthetic diamond. In certain embodiments, the mirror is affixed to the transparent heat spreader via direct bonding. In certain embodiments, the mirror is deposited on the heat spreader, and the mirror is then bonded to the gain medium.

Figure 8:
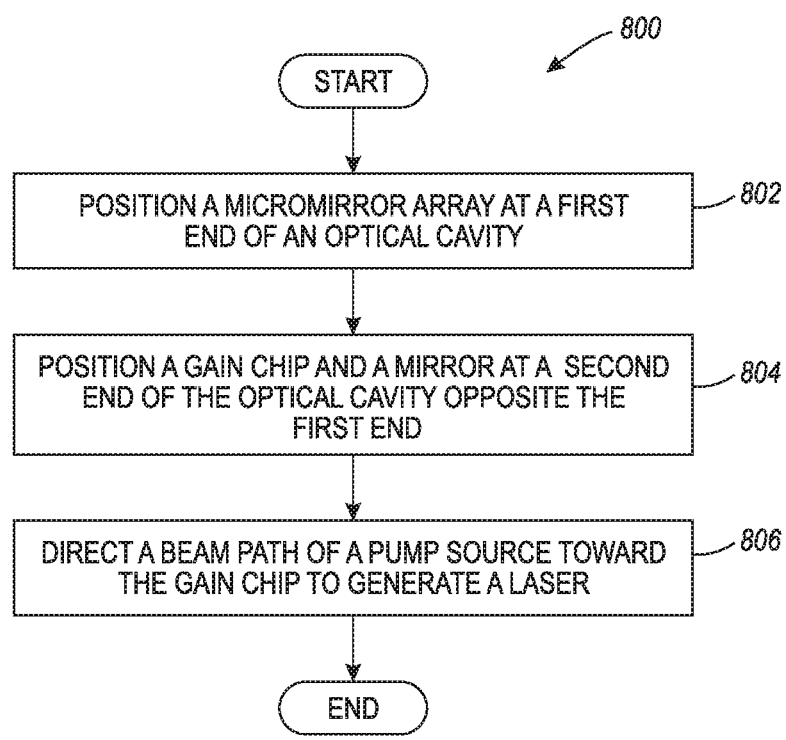
FIG. 8 is a flow diagram illustrating a method of constructing a VECSEL device and generating a laser in accordance with certain embodiments of the present disclosure.

FIG. 8 is a flow diagram illustrating an exemplary method 800 of constructing a laser device (e.g., the laser device 100) and generating a laser in accordance with certain embodiments of the present disclosure. The method 800 begins at block 802, wherein a micromirror array (e.g., the micromirror array 102) is positioned at a first end of an optical cavity (e.g., the optical cavity 108). At block 804, a gain chip (e.g., the gain chip 104) and a mirror (e.g., the mirror 114) is positioned at a second end of the optical cavity opposite the first end, such that the gain chip is facing concave surfaces of the curved micromirrors of the micromirror array. The gain chip includes a gain medium (e.g., the gain medium 110).

At block 806, a beam path of a pump source is directed toward the gain chip to generate the laser emission. In certain embodiments, the pump source is a laser source or an electron beam source. In certain embodiments, the beam path is directed toward the gain chip at an incident angle (e.g., the incident angle 122) from 10° to 80°. In certain embodiments, the incident angle is from 30° to 60°. In certain embodiments, the incident angle is from 40° to 50° (e.g., 45°).

Figure 9:
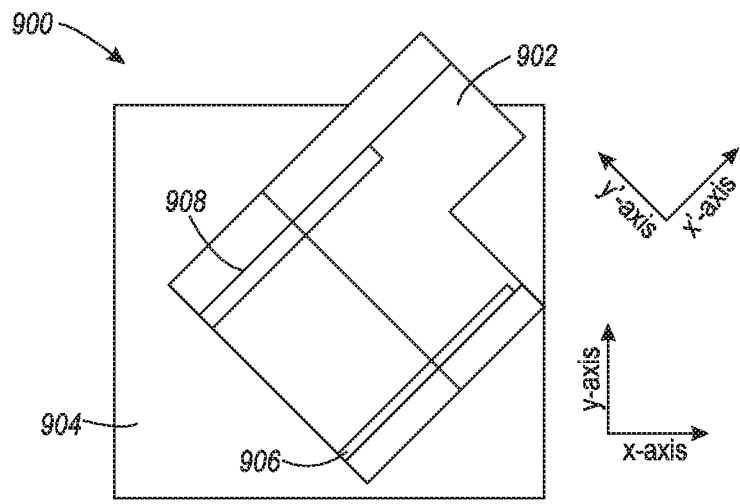
FIG. 9 is an orthographic front view of a holder for positioning and aligning a micromirror array and a gain chip.
Figure 10:
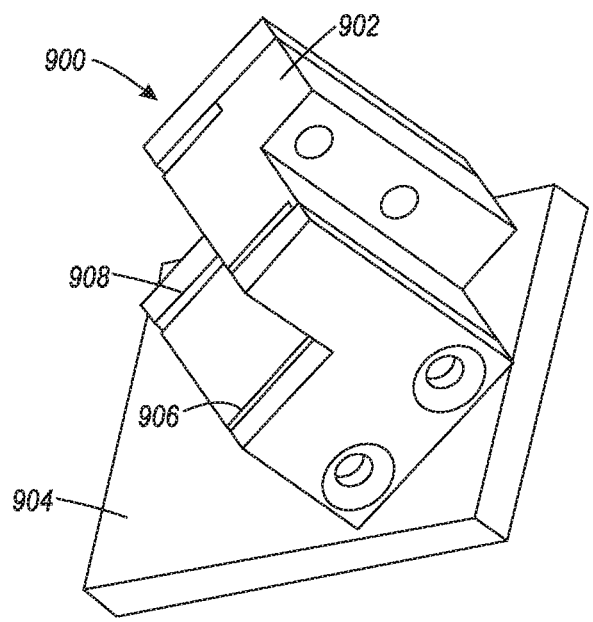
FIG. 10 is projection view of the holder.

FIGS. 9 and 10 depict an illustrative embodiment of a holder 900 for positioning and aligning a micromirror array and a gain chip, which may be used in accordance with any of the embodiments described herein. The holder 900 includes a support structure 902 that protrudes outwardly from a back plate 904, which may be mounted to a larger structure. In certain embodiments, the holder 900 comprises a single material, or may comprise multiple materials affixed to each other. For example, the holder 900 may be made from a single piece of metal, ceramic material, or plastic. As another example, the support structure 902 may be made from one material that is affixed to the back plate 904, which each being independently selected from metal, ceramic material, or plastic.

The support structure 902 includes a sample slot 906 for securing a gain chip mounted onto a heat spreader (e.g., the gain chip 104, mirror 114, and heat spreader 116 structure). In certain embodiments, the heat spreader is in a form of a rectangular glass support that is thin enough to fit within the sample slot 906. In certain embodiments, if the holder 900 is made from a conductive material, the holder 900 may provide a conductive path between the gain chip and ground. For example, the support structure 902 may contain one or more leads that contact the gain chip (e.g., metal contacts 118 on the gain chip 104) that electrically couple the gain chip to the holder 900.

The support structure 902 further includes a mirror slot 908 for securing a micromirror array (e.g., micromirror array 102, 200, or 300). The locations of the sample slot 906 and the mirror slot 908 may be chosen during fabrication of the holder 900 to define the cavity length. In certain embodiments, the support structure 902 may include additional structures, such as clamps, to assist in positioning and aligning the micromirror array and gain chip.

The holder 900 may be placed at an angle to an incident laser or electron beam, which can be beneficial in avoiding partial light absorption by a DBR of the gain chip when pumping with a laser, or avoiding electron beam scattering when pumping with an electron beam. The incident beam may be directed along the x-axis toward the gain chip. The gain chip may be arranged such that normal direction of the gain chip (i.e., a direction parallel to the cavity length) is oriented along the y'-axis. In certain embodiments, the incident angle is from 10° to 80° (i.e., the x'y'-axis is rotated from 10° to 80° with respect to the xy-axis). In certain embodiments, the cavity length (i.e., the shortest distance between the sample slot 906 and the mirror slot 908) is from 5 mm to 15 mm (e.g., 10 mm).

In certain embodiments, the holder 900 may be inserted into a vacuum tube of an electron beam pumping system or placed in the path of a laser source. For electron beam pumping embodiments, the electron beam can be moved vertically and horizontally to pump different areas on the gain chip that are aligned to different micromirrors of the micromirror array.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter.

Although embodiments of the disclosure were discussed in the context of VECSEL devices, one or more of the components described herein may be utilized in other optical systems. Thus, embodiments of the disclosure are not limited to VECSEL devices.

In the foregoing description, numerous details were set forth. It will be apparent, however, to one of ordinary skill in the art having the benefit of this disclosure, that the embodiments of the present disclosure may be practiced without these specific details. In some instances, certain structures and devices are shown in block diagram form, rather than in detail, in order to avoid obscuring the present disclosure. It is to be understood that the details of such structures and devices, as well as various processes for producing the same, would be within the purview of one of ordinary skill in the art.

The terms "above," "under," "between," and "on" as used herein refer to a relative position of one layer with respect to other layers. As such, for example, one layer deposited or disposed above or under another layer may be directly in contact with the other layer or may have one or more intervening layers. Moreover, one layer deposited or disposed between layers may be directly in contact with the layers or may have one or more intervening layers. In contrast, a first layer "on" or deposited "onto" a second layer is in contact with that second layer. Additionally, the relative position of one layer with respect to other layers is provided assuming the initial disk is a starting substrate and the subsequent processing deposits, modifies and removes films from the substrate without consideration of the absolute orientation of the substrate. Thus, a film that is deposited on both sides of a substrate is "over" both sides of the substrate.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an embodiment" or "one embodiment" means that a particular feature, structure, or characteristic described in connection with the embodiment is included in at least one embodiment. Thus, the appearances of the phrase "an embodiment" or "one embodiment" in various places throughout this specification are not necessarily all referring to the same embodiment.

The present disclosure is not to be limited in scope by the specific embodiments described herein. Indeed, other various embodiments of and modifications to the present disclosure pertaining to laser devices, in addition to those described herein, will be apparent to those of ordinary skill in the art from the preceding description and accompanying drawings. Thus, such other embodiments and modifications pertaining to laser devices are intended to fall within the scope of the present disclosure. Further, although the present disclosure has been described herein in the context of a particular embodiment in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein, along with the full scope of equivalents to which such claims are entitled.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A laser device comprising:
   a gain chip comprising a gain medium adapted for stimulated photon emission; and
   a mirror; and
   a micromirror array comprising a plurality of curved micromirrors, wherein the gain chip is disposed between the mirror and the micromirror array, wherein the micromirror array and the mirror define an optical cavity, and wherein the micromirror array is oriented such that at least one of the plurality of curved micromirrors is to reflect light generated by the gain medium back toward the gain medium and the mirror along a length of the optical cavity.

2. The laser device of claim 1, wherein each of the plurality of curved micromirrors comprises a distributed Bragg reflector (DBR) layer.

3. The laser device of claim 1, wherein the length of the optical cavity is from 3 millimeters (mm) to 15 mm.

4. The laser device of claim 1, wherein each of the plurality of curved micromirrors has a radius of curvature of 10 mm to 30 mm.

5. The laser device of claim 1, wherein a center-to-center pitch of the micromirror array is 0.05 mm to 2 mm.

6. The laser device of claim 1, further comprising:
   a pump source arranged to direct an electron beam toward the gain medium along a direction non-parallel to the length of the optical cavity.

7. The laser device of claim 1, further comprising:
   a transparent heat spreader disposed below the mirror of the gain chip, wherein the mirror comprises DBR layer.

8. The laser device of claim 1, wherein the gain medium is selected from a multiple quantum well (MQW) structure, a quantum dot layer, a double heterojunction, and combinations thereof.

9. The laser device of claim 1, wherein the laser device is incorporated into a vacuum tube.

10. A method of generating a laser, the method comprising:
    orienting an electron beam source toward a gain medium of a gain chip; and
    causing the electron beam source to emit an electron beam onto the gain medium to excite light emission by the gain medium, wherein:
      the gain chip is disposed between a mirror and a micromirror array,
      the gain chip is disposed at a first end of an optical cavity;
      the micromirror array is disposed at a second end of the optical cavity opposite the first end;
      the micromirror array comprising a plurality of curved micromirrors;
      the light emitted by the gain chip is reflected back toward the gain chip by at least one of the plurality of curved micromirrors to focus the laser; and
      the laser is emitted through the mirror at the first end of the optical cavity or through the micromirror array at the second end of the optical cavity.

11. The method of claim 10, wherein each of the plurality of curved micromirrors comprises a DBR layer.

12. The method of claim 10, wherein a length of the optical cavity is from 3 mm to 15 mm, and wherein each of the plurality of curved micromirrors has a radius of curvature of 10 mm to 30 mm.

13. The method of claim 10, wherein a center-to-center pitch of the micromirror array is 0.05 mm to 2 mm.

14. The method of claim 10, wherein the gain chip is in contact with the mirror, and wherein the mirror comprises a DBR.

15. The method of claim 10, wherein an emission wavelength of the laser is from 200 nm to 400 nm.

16. A method of constructing a laser device, the method comprising:
    positioning a micromirror array at a first end of an optical cavity, the micromirror array comprising a plurality of curved micromirrors; and
    positioning a gain chip at a second end of the optical cavity opposite the first end, the gain chip comprising a gain medium and a mirror, wherein the micromirror array is oriented such that light generated by the gain chip is reflected back to the gain chip and the mirror along a length of the optical cavity by the plurality of curved micromirrors.

17. The method of claim 16, further comprising:
    forming the plurality of curved micromirrors by depositing layers of dielectric material with alternating refractive indices onto a substrate having an array of concave microlenses or convex microlenses formed thereon.

18. The method of claim 16, wherein each of the plurality of curved micromirrors has a radius of curvature of 10 mm to 30 mm.

19. The method of claim 16, wherein a center-to-center pitch of the micromirror array is 0.05 mm to 2 mm.

20. The method of claim 16, wherein the length of the optical cavity is from 3 mm to 15 mm.

* * * * *